United States Patent
Barringer et al.

(10) Patent No.: US 6,511,574 B2
(45) Date of Patent: Jan. 28, 2003

(54) FIXTURE FOR SECURING HARD STOPS TO A SUBSTRATE

(75) Inventors: Dennis Barringer, Wallkill, NY (US); Mark A. Marnell, Kingston, NY (US); Steven J. Mazzuca, New Paltz, NY (US); Donald W. Porter, Highland, NY (US); Roger R. Schmidt, Poughkeepsie, NY (US); Wade H. White, Hyde Park, NY (US)

(73) Assignee: International Business Machines Corporation, Armonk, NY (US)

(*) Notice: Subject to any disclaimer, the term of this patent is extended or adjusted under 35 U.S.C. 154(b) by 149 days.

(21) Appl. No.: 09/764,592

(22) Filed: Jan. 18, 2001

(65) Prior Publication Data

US 2002/0092594 A1 Jul. 18, 2002

(51) Int. Cl.$^7$ ................................................ B32B 35/00
(52) U.S. Cl. .................... 156/295; 156/304.3; 156/305; 156/538; 156/556; 269/287; 269/289 R; 269/303; 269/903
(58) Field of Search ............................... 156/60, 304.1, 156/304.3, 305, 295, 538, 556; 269/287, 289 R, 303, 903

(56) References Cited

U.S. PATENT DOCUMENTS

| | | |
|---|---|---|
| 5,368,673 A | 11/1994 | Okuda et al. |
| 5,782,400 A | 7/1998 | Susicki |
| 5,788,225 A | 8/1998 | Iwata et al. |
| 6,202,293 B1 * | 3/2001 | Schaller et al. |
| 6,262,582 B1 * | 7/2001 | Barringer et al. |
| 6,265,887 B1 * | 7/2001 | Barringer et al. |
| 6,378,857 B1 * | 4/2002 | Taylor |

FOREIGN PATENT DOCUMENTS

JP  9232345 A  9/1997

* cited by examiner

Primary Examiner—Curtis Mayes
(74) Attorney, Agent, or Firm—Floyd A. Gonzalez; Cantor Colburn LLP

(57) ABSTRACT

An exemplary embodiment is a fixture for securing hard stops to a substrate. The fixture has a base which provides support to the fixture. The base has a cavity configured for nestably supporting a substrate. A top plate is mounted on the base, the top plate is configured for mounting the substrate. An alignment plate is disposed on the top plate separate from the base. An adjusting plunger assembly is coupled to the base. The adjusting plunger assembly is configured for use with attaching a hard stop to the substrate. A plunger is coupled to the base substantially perpendicular to the adjusting plunger assembly. The plunger is configured for use with supporting the substrate. A method of using a fixture is disclosed comprising disposing a substrate in a base of the fixture and mounting a hard stop to the substrate. An adhesive is disposed between the hard stop and the substrate. The substrate is mounted between a plunger and a top plate. The hard stop on the substrate is aligned with an alignment plate. An adjusting plunger assembly is adjusted to mount the hard stop to the substrate.

16 Claims, 1 Drawing Sheet

ABSTRACT

FIXTURE FOR SECURING HARD STOPS TO A SUBSTRATE

BACKGROUND

Semi-conductor test systems are used for testing integrated circuit devices to verify their performance characteristics. For limited volume testing, the integrated circuit device can be placed in a test fixture that is mounted on a device-under-test (DUT) board, or the DUT board can be docked with a semi-conductor wafer prober or package handler for high volume production testing.

A problem arises when the "test head" assembly, currently used on industry testers, docks (comes in contact) with the DUT board assembly. The movable test head docks with a prober. The prober holds the DUT board assembly and moves product wafers to the probe tips and removes wafers after test. When the test head assemblies dock with a prober, the hardware which holds the DUT board assembly gets deflected. This deflection causes non-symmetrical distortion of the probe tip plane. The probe mechanism must be adjusted in order to maintain a constant plane between the probe tip plane and the DUT board assembly. Because of the time consuming process of adjusting the probe tip plane and the probe mechanism and the difficulty in observing and manipulating the probe mechanism, current systems are inefficient and difficult to use. The non-symmetrical distortion of the probe tip plane and the probe mechanism creates time consuming adjustments.

A probe planarity compensating and aligning mechanism can be used to prepare the DUT before the test process to eliminate the time consuming adjustment process. A ceramic substrate used in the DUT is best positioned for testing if it can be rigidly mounted. Hardened brackets called hard stops are attached to the ceramic substrate to improve the mounting capability of the ceramic substrate. In order to attach these hard stops a toughened, thermally cured, modified structural epoxy is used to attach the hard stops to the ceramic substrate. The hard stops are required to be attached consistently, efficiently and with precision. The epoxy thickness dimensions, corrosive processing and elevated temperatures create difficulties in the attachment process. The thermal coefficient of expansion of the materials cause the components to shift when thermal energy is added to the components during the attachment process. What is needed in the art is a device that can enable the attachment process to be accomplished while maintaining consistent attachment precision of the hard stop to the substrate.

SUMMARY OF THE INVENTION

An exemplary embodiment is a fixture for securing hard stops to a substrate. The fixture has a base which provides support to the fixture. The base has a cavity configured for nestably supporting a substrate. A top plate is mounted on the base, the top plate is configured for mounting the substrate. An alignment plate is disposed on the top plate separate from the base. An adjusting plunger assembly is coupled to the base. The adjusting plunger assembly is configured for use with attaching a hard stop to the substrate. A plunger is coupled to the base substantially perpendicular to the adjusting plunger assembly. The plunger is configured for use with supporting the substrate. A method of using a fixture is disclosed comprising disposing a substrate in a base of the fixture and mounting a hard stop to the substrate. An adhesive is disposed between the hard stop and the substrate. The substrate is mounted between a plunger and a top plate. The hard stop on the substrate is aligned with an alignment plate. An adjusting plunger assembly is adjusted to mount the hard stop to the substrate.

BRIEF DESCRIPTION OF THE DRAWINGS

Referring now to the exemplary drawings wherein like elements are numbered alike in the several FIGURES.

DETAILED DESCRIPTION OF THE PREFERRED EMBODIMENTS

Figure 1:
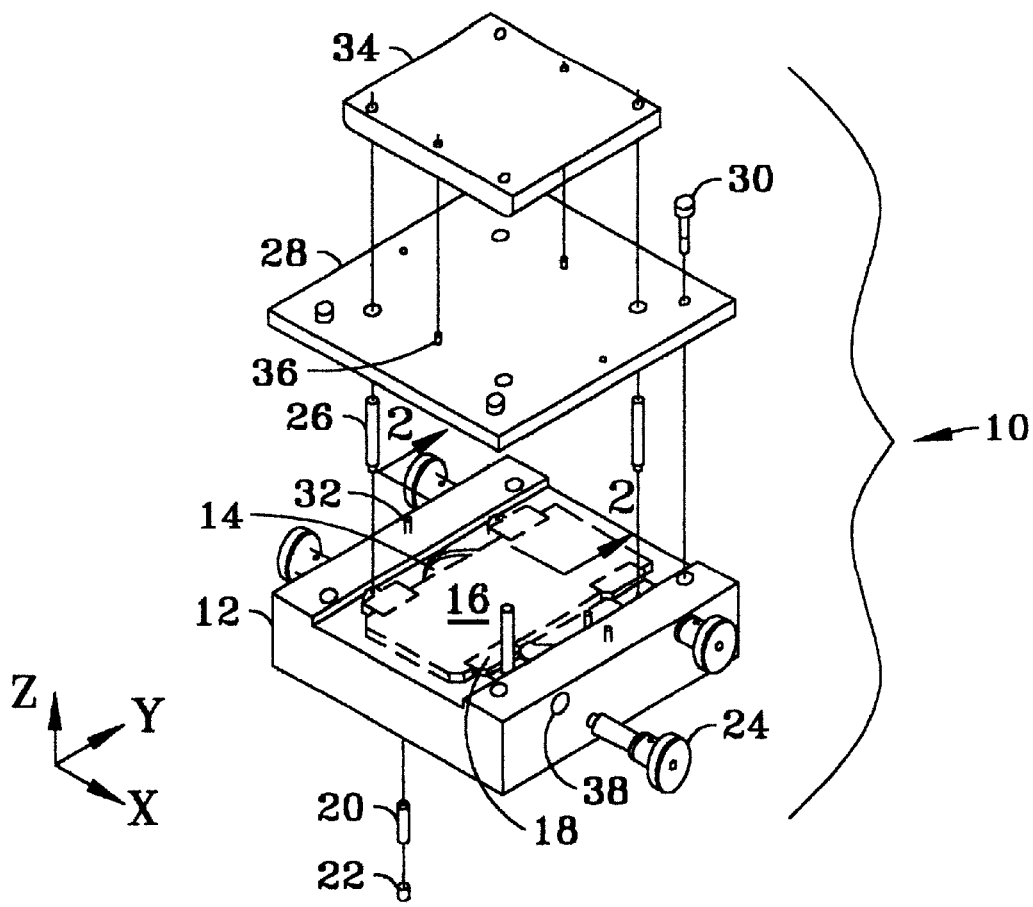
FIG. 1 is an exploded perspective view of an exemplary diagram of a fixture.

Referring now to the drawings, FIG. 1 shows an exploded view of an exemplary embodiment of an "L" shaped hard stop compensating fixture, hereinafter, fixture 10. The fixture 10 can be employed in the process of preparing a substrate 16 for installation into a into a planarity compensating and aligning mechanism (not shown).

The substrate 16 comprises a ceramic material generally formed into a rectangular shaped plate. The substrate 16 can be used for wafer testing. In order to install the substrate 16 into the aligning mechanism, hard stops 18 known as "L" shaped brackets or bond blocks are attached to the edges of the substrate 16. The hard stops 18 are hard, rigid structures affixed to the ceramic substrate 16 to provide a mechanically durable hard surface that facilitates mounting the substrate 16 into the alignment mechanism (not shown). FIG. 1 shows the use of four hard stops 18 (shown in dotted lines in FIG. 1) attached along the long sides of the substrate 16. The hard stops 18 can comprise an iron and nickel alloy (e.g. INVAR) having a low coefficient of thermal expansion. The hard stops 18 are attached to the substrate 16 employing an adhesive such as a toughened, thermally cured, modified structural epoxy. The fixture 10 can facilitate the attachment of the hard stops 18 to the substrate 16. The substrate 16 with the hard stops 18 attached are nestable within the fixture 10.

A base 12 provides support structure for the fixture 10. The base 12 has a cavity 14 for receiving a substrate 16 having hard stops 18 attached to the substrate 16 (shown in dotted lines in FIG. 1). The base 12 comprises a rigid material that withstands the environment necessary to set the hard stops 18 onto the substrate 16 with epoxy which can be a corrosive process at elevated temperatures. The base 12 can comprise a graphite material. In one embodiment the base 12 is a rectangular box shape, hollowed out to form the cavity 14. Any configuration that is capable of supporting and containing the substrate 16 is contemplated.

A plunger 20 is disposed through the base 12 at strategic locations throughout the base 12 in order to adjustably support the substrate 16 as it is set into the fixture 10. Any number of plungers 20 necessary to adjustably support the substrate 16 is contemplated. An embodiment as diagramed, employs four plungers 20 located substantially near each of the four corners of the rectangular substrate 16. A means for adjusting the plunger 20 can be integral to the plunger 20 or independent of the plunger 20. A set screw 22 can be threadably disposed in the base 12 such that the set screw 22 can threadably adjust the plunger 20 disposed in the base 12. At least one set screw 22 can be employed for each plunger 20. The set screw 22 can be a locking set screw.

An adjusting plunger assembly 24 can be disposed through the base 12 at precision bores 38. The adjusting plunger assembly 24, similarly to the plunger 20, adjustably supports the substrate 16 and additionally the hard stops 18. The adjusting plunger assembly 24 can also press the hard stops 18 onto the substrate 16 as part of attaching the hard stops 18 to the substrate 16. The embodiment as shown in FIG. 1, shows four adjusting plunger assemblies 24 located substantially near the four corners of the base 12 and correspondingly substantially near the four hard stops 18 attached to the nested substrate 16. Any number of adjusting plunger assemblies 24 can be employed to correspond to the number of hard stops 18. The adjusting plunger assembly 24 and the plunger 20 can be employed together to adjustably support the hard stops 18 and the substrate 16 during the attachment process.

Handle studs 26 are employed to assist in the placement and installation of the hard stops 18 onto the substrate 16. The handle studs 26 can be rod shaped elements. Any shape that provides for placement and installation of the hard stops 18 can be employed. One embodiment as shown in FIG. 1, employs four handle studs 26 mountable to the hard stops 18. The handle studs 26 can be coupled to the hard stops by threaded fittings. The handle studs 26 comprise materials compatible with the environment of the attachment process of the hard stops 18 to the substrate 16.

A top plate 28 is mounted on the base 12 covering the substrate 16. The top plate 28 can cover and adjustably support the substrate 16 nested in the cavity 14 of the base 12. The top plate 28 can be a platen shape or any shape that supports the mounting of the substrate 16 in the base 12. In an embodiment as shown in FIG. 1, the top plate 28 can be a rectangular plate that matches the perimeter of the rectangular base 12. The top plate 28 has a bore for receiving a captive screw 30. There can be a number of captive screws 30 used to removably mount the top plate 28 to the base 12. One embodiment, can have four captive screws 30 that dispose through bores in the top plate 28 substantially near the four corners of the base 12. The captive screws 30 fasten down the top plate 28 such that the top plate 28 adjoins at least two surfaces of the base 12. A locator stud 32 is disposed on the base 12 for locating and aligning the top plate 28 into an arranged orientation. A number of locator studs 32 can be employed to align the top plate 28. One embodiment contemplates the use of two locator studs 32, as shown in FIG. 1.

An alignment plate 34 is mounted on the top plate 28 on an opposite side of the top plate 28 from the base 12 and substrate 16. The alignment plate 34 can be used to provide alignment for the handle studs 26 and subsequently for the hard stops 18. The alignment plate 34 can be a platen shape and in one embodiment a rectangular shaped plate. The alignment plate 34 can be robustly thick such that it maintains proper dimensions during the attachment process of the hard stops 18 to the substrate 16. The alignment plate 34 has bores throughout to receive the handle studs 26 as the handle studs 26 are disposed therethrough. Alignment studs 36 can be disposed on the top plate 28 in order to receivably align the alignment plate 34. One embodiment can have the alignment studs 36 on the surface that is adjacent the alignment plate 34 when the alignment plate 34 is mounted on the top plate 28. Any number of alignment studs 36 are contemplated, two alignment studs 36 are shown in FIG. 1. The alignment studs 36 can also be disposed on the alignment plate 34 to correspond to bores through the top plate 28 such that the top plate 28 and the alignment plate 34 are properly aligned.

Figure 2:
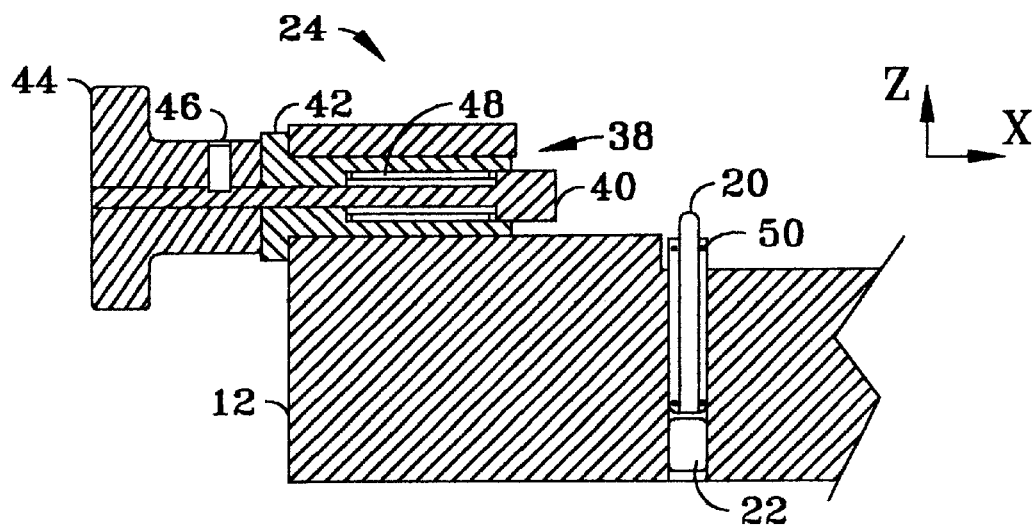
FIG. 2 is a sectional side view along line 2—2 from FIG. 1.

Turning now to FIG. 2, a sectional view of part of the fixture 10 along line 2—2 of FIG. 1 is shown. The fixture 10 supports and aligns the hard stops 18 and the substrate 16 during the attachment of the hard stops 18 to the substrate 16.

The substrate 16 requires adjustment in order to receivably bond with the hard stops 18, thus the plunger 20 and the set screw 22 function to adjust the substrate 16 substantially on the "z" plane as shown oriented in FIG. 1 and FIG. 2. Once the substrate 16 has been adjusted by the plunger 20 with set screw 22, the substrate can be mounted such that specific tolerances between the substrate 16 and the hard stops 18 can be achieved. In one embodiment, there are four plungers 20 with a set screw 22 for each of the four plungers 20. The four plungers 20 support the rectangular substrate 14 at the regions near the four corners of the rectangular substrate 16. The plunger 20 can be spring biased such that a spring applies a force on the substrate 16 maintaining the substrate mounted. A biasing member 50 can be coupled to the plunger 20 to maintain the plunger 20 biased against the substrate 16. The plunger 20, in one embodiment, is a cylindrical rod shape, with a rounded tapered tip proximate to the substrate 16 where the plunger 20 contacts the substrate 16. The plunger 20 and the top plate 28 (shown in FIG. 1) provide the support for the substrate 16 during the process of attaching the hard stops 18 to the substrate 16. The top plate 28 provides the planar support to the substrate 16 as the plungers 20 are adjusted to fix the substrate 16 in a mounted position. By employing the plungers 20 and the top plate 28, the varying coefficients of thermal expansion can be compensated such that any displacement in the "z" plane is accounted for in the attachment process.

The substrate 16 and the hard stops 18 are supported on the "x" plane by employing the adjusting plunger assembly 24. The adjusting plunger assembly 24 is mountably disposed through the precision bores 38 of the base 12. A retractable plunger 40 is nestably disposed in a mounting bushing 42. The mounting bushing is disposed in the precision bore 38. In one embodiment, the mounting bushing 42 is threaded coupled to the precision bore 38. A handle 44 is also disposed on the retractable plunger 40. The handle 44 can be fixed to the retractable plunger 40 with a set screw 46. The retractable plunger 40 can be spring biased by a biasing member 48 disposed on the retractable plunger 40. The biasing member 48 can be disposed within the mounting bushing 42 such that the retractable plunger 40 is biased distally from the handle 44. The biasing member 48 provides the force necessary to adjustably support the hard stops 18 against the substrate 16. The biasing member force is transferred through the retractable plunger 40. The force of the biasing member 48 can be made consistent such that the same force is applied time after time. The adjusting plunger assembly 24 can be adjusted through the use of the mounting bushing 42, the handle 44 adjustment and the biasing member 48 in order to support the hard stops 18 and the substrate 16.

The combination of the subcomponents of the adjusting plunger assembly 24 allows for an attachment process that is repeatable. The hard stops 18 can be attached in the same place each time the process occurs. The biasing member 48 can apply the same force against the hard stop 18 and subsequently the adhesive (not shown) disposed between the hard stop 18 and the substrate 16 such that the adhesive is a consistent thickness after each application. In one embodiment, the adjusting plunger assembly 24 can squeeze down the adhesive between the bonding block 18 and the substrate 16 to a thickness of about two mils on every application. Just as the top plate 28 and the plunger 20 account for the thermal expansion in the "z" plane, the adjusting plunger assemblies 24 compensate in the "x" plane for any coefficients of thermal expansion in the materials.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A fixture comprising:
    a base for providing support to said fixture; said base having a cavity configured for nestably supporting a substrate;
    a top plate mounted on said base; said top plate being configured for mounting the substrate;
    an alignment plate disposed on said top plate separate from said base;
    an adjusting plunger assembly coupled to said base; said adjusting plunger assembly being configured for use with attaching a hard stop to the substrate; and
    a plunger coupled to said base substantially perpendicular to said adjusting plunger assembly; said plunger being configured for use with supporting the substrate.

2. The fixture as in claim 1, wherein, said adjusting plunger assembly includes a retractable plunger nestably disposed in a mounting bushing, a biasing member disposed in said mounting bushing and biased against said retractable plunger, and a handle disposed on said retractable plunger adjacent said mounting bushing, said biasing member being configured for use with forcing the hard stop against the substrate.

3. The fixture as in claim 1, wherein, said plunger including a spring bias, said plunger is adjustably coupled to said base with a set screw.

4. The fixture as in claim 1, wherein, said top plate is mounted to said base with a captive screw.

5. The fixture as in claim 1, further comprising:
    a handle stud disposed through said top plate and disposed through said alignment plate, wherein said handle stud is configured for coupling to the hard stop to transport the hard stop.

6. The fixture as in claim 5, wherein, said plunger and said top plate are adjustable for supporting the substrate.

7. The fixture as in claim 6, wherein, said adjusting plunger assembly is biased for supporting the hard stop being affixed to the substrate.

8. The fixture as in claim 7, wherein, said adjusting plunger assembly supports in a plane perpendicular to the plane that said plunger and said top plate supports.

9. The fixture of claim 8, wherein, said adjusting plunger assembly biases the hard stops against the substrate when the hard stops are being attached to the substrate.

10. The fixture of claim 9, wherein, said adjusting plunger assembly is disposed in said base with a precision bore.

11. The fixture of claim 10 wherein, said adjusting plunger assembly disposed in said precision bore aligns the hard stop to the substrate consistently in the same location.

12. The fixture of claim 8, wherein, said adjusting plunger assembly and said plunger and said top plate for supporting the substrate and the hard stop, compensate for the coefficients of thermal expansion of the substrate and the hard stops.

13. The fixture as in claim 1, wherein, said top plate is aligned with said base by locator studs.

14. The fixture as in claim 1, wherein, said alignment plate is aligned with said top plate by alignment studs.

15. A method of using a fixture comprising:
    disposing a substrate in a base of said fixture;
    mounting a hard stop to said substrate;
    disposing an adhesive between said hard stop and said substrate;
    mounting said substrate between a plunger and a top plate;
    aligning the hard stop on the substrate with an alignment plate
    adjusting an adjusting plunger assembly to position the hard stop to the substrate.

16. The method of using the fixture as in claim 15, wherein, adjusting said adjusting plunger assembly squeezes the adhesive to a predetermined dimension repeatably.

* * * * *